(12) United States Patent
Field

(10) Patent No.: US 6,773,614 B2
(45) Date of Patent: Aug. 10, 2004

(54) METHOD OF PATTERNING CONDUCTIVE FILMS

(75) Inventor: Marshall Field, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 73 days.

(21) Appl. No.: 10/124,142

(22) Filed: Apr. 16, 2002

(65) Prior Publication Data

US 2003/0192855 A1 Oct. 16, 2003

(51) Int. Cl.$^7$ ................................. B44C 1/22
(52) U.S. Cl. ............................ 216/5; 216/24; 428/103
(58) Field of Search .............................. 216/5, 13, 24, 216/25, 60; 438/29; 428/103, 276

(56) References Cited

U.S. PATENT DOCUMENTS

2002/0013013 A1    1/2002   Victor et al. .................. 438/57

FOREIGN PATENT DOCUMENTS

WO         WO 02/07235         1/2002

OTHER PUBLICATIONS www.sciencemag.org;"High Resolution Inkjet Printing Of All–Polymer Transistor Circuits"; Science; vol. 290; Dec. 15, 2000; pp: 2123–2126.
http://www.i–components.co.kr/english/products_1.htm; i–components; Agfa Products; Mar. 15, 2002; 3 pages.
http://www.bekaert.com/eng/PRESS/e20000504.htm; Press Release–Agfa And Bekaert Working Together World–Wide To Market New Orgacon Film dated May 4, 2000; Mar. 15, 2002; 2 pages.
http://www.agfa.com/sfc/polymer/el_lamps/; AGFA– EL Lamps; Mar. 15, 2002; 1 page.
http://www.toyobo.co.jp/e/seihin/tcf/hyo.htm; Film Structure–Properties Of Standard ITO Film Products; Mar. 15, 2002; 2 pages.
http://www.catize.com/baytronPspecs.html; Baytron P Product Information; LIGNO–PANI Specifications; Mar. 15, 2002; 4 pages.
http://www.bayer–echemicals.com/products/Individual%20Products/Baytron%20P.html; Baytron P VP A1 4083; Mar. 15, 2002; 1 page.
http://www.cpfindusprod.com/ITO/oc.html; The Optical Coated Films Product Line—Optical Coated—ITO; Mar. 15, 2002; 2 pages.
NATO Advanced Research Workshop on Electrochemistry Of Electroactive Polymer Films WEEPF–2000; "The Transition From Metal To Semiconductor In Poly(3, 4–ethylenedioxythiophene) Thin Films"; by: T. Johansson, L.A.A. Pettersson, O. Inganas; Abstract No. 11; 1 page, no date.
http://www.user.tu–cottbus.de/ mikalo/pedot.html; PEDOT Polymer Films; Mar. 15, 2002; 1 page.
AGFA; "Orgacon EL–1500 Transparent Conductive Films For General Applications"; 2 pages, no date.
AGFA; "Orgacon Transparent Electrodes For EL Lamps"; revised May 2001; 2 pages.
AGFA; "Orgacon– Patterning Orgacon Film By Means Of UV Lithography. Guidelines"; Revised May 2001; 3 pages.

*Primary Examiner*—William A. Powell

(57) ABSTRACT

Electrically conductive film, used for electroluminescent displays and electroplated films, treated by printing with ink on the surface of the film, the ink causing activation of the film wherever printing occurs.

40 Claims, 5 Drawing Sheets

METHOD OF PATTERNING CONDUCTIVE FILMS

FIELD OF THE INVENTION

The present invention relates to electrically conductive film used to coat electroluminescent displays.

BACKGROUND OF THE INVENTION

Electroluminescent lamps comprising a transparent conductive base are known in the art. In general, a thin polyester film with an indium-tin oxide (ITO) coating has most often been used for this purpose. These ITO films are manufactured by vacuum sputtering techniques. Screen printing the conductive paste is another method of manufacturing the films.

More recently, poly(3,4-ethylenedioxythiophene)/poly(styrenesulfonate), sometimes abbreviated PEDT/PPS or PEDOT (manufactured and sold under the trade name Orgacon® by AGFA Gevaert) has been found to be a desirable material for use as a transparent conductive base for electroluminescent lamps. Unlike ITO film, which is easily damaged because the inorganic material is very brittle, the PEDOT polymer transparent conductive coating on a polyester film can be stretched, folded and can tolerate surface damaging before the surface conductivity is affected. For these reasons, PEDOT film is better than ITO in less delicate manufacturing processes such as industrial screen-printing. It is known that the electrical conductivity of PEDOT film can be deactivated in areas where the surface is "painted" with solvent such as 10% NaCIO bleach. It would be desirable to find a way to deactivate very specific points on the PEDOT film surface in a predictable, repeatable manner.

SUMMARY OF THE INVENTION

The present invention relates to a method of patterning an electroluminescent light, comprising the steps of:
  printing ink patterns onto an electrically conductive polymer film layer of the electroluminescent light, the electrical conductivity of the film being significantly deactivated where the ink patterns are printed;
  conducting voltage through the electroluminescent light to display the patterns formed where the ink patterns deactivate the electrical conductivity on the polymer film layer.

The present invention also relates to an electroluminescent light panel comprising an electrically conductive polymer film layer printed with ink patterns, the electrical conductivity of the film being significantly deactivated where the ink patterns are printed.

The present invention additionally relates to a method of making an electroplated film, comprising the steps of:
  printing ink patterns onto an electrically conductive polymer layer web, the electrical conductivity of the film being significantly deactivated where the ink patterns are printed;
  plating the printed web to form electrical interconnects by depositing conductive metals.

The present invention further relates to an electroplated film comprising an electrically conductive polymer film layer printed with ink patterns, the electrical conductivity of the film being significantly deactivated where the ink patterns are printed; and electrical interconnects formed on the polymer film layer by deposited conductive metals.

DETAILED DESCRIPTION OF THE INVENTION

Figure 1:
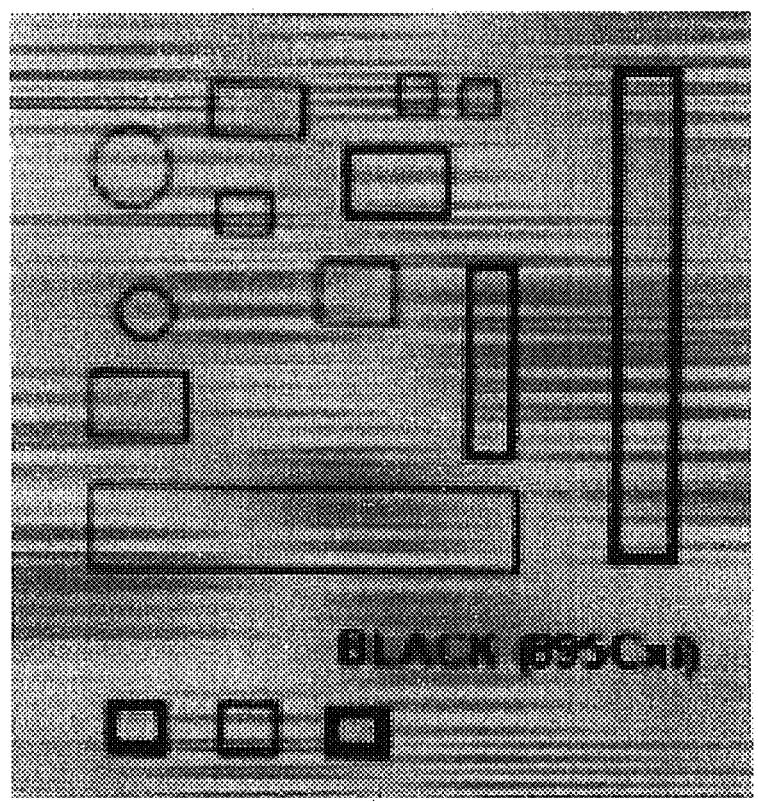
FIG. 1 is a photograph of a square of 125 $\mu$m PET covered by a film of PEDOT, inkjet printed with various forms in black ink.

The invention relates to polymer films that are capable of conducting electricity. The invention more specifically relates to a method of deactivating, i.e., making non-conductive, specific portions of these polymer films by printing certain selected inks in a pattern on the surface of the film. This patterning can be used, for example, to isolate defined areas on a thick-film electroluminescent display. By this method, digitally printed images can be displayed as either static or moving images across the electroluminescent display.

The conductive polymer films used in the present invention can be made with various materials including triarylamine derivatives, polythiophenes such as poly(3,4-ethylenedioxythiophene)/poly(styrenesulfonate) and polyaniline derivatives. The most preferred is poly(3,4-thylenedioxythiophene)/poly(styrenesulfonate), sometimes abbreviated PEDT/PPS or PEDOT (manufactured and sold under the trade name Orgacon® by AGFA Gevaert).

It has been found that PEDOT film can be segmented into individually-addressable areas by printing certain HP inks onto the PEDOT surface. Where the ink contacts PEDOT, the electrical conductivity is sharply reduced. If the pattern is printed on several different areas of the PEDOT surface, the voltage can be switched on and off between the different areas to randomly flash words or images. If the pattern is such that the segregated areas are arranged to be contiguous, a serial controller which switches the EL voltage can illuminate images placed over the patterned areas and give the illusion of motion. Such moving images can be used in commercial signage, advertising, or simply as novelty desk or home items.

With electroluminescent panels as a backlight for digital images printed with ink that deactivates and/or isolates relevant areas of PEDOT coated film, animation, cartoons or attention-getting signs can be created by consumers either at work or at home.

In a preferred embodiment, a half tone effect can be achieved with the deactivation and/or isolation of specific areas of PEDOT coated film by printing the ink on the PEDOT in a way that creates a pattern of black and white dots to simulate shades of gray. This enables the printing of Grayscale (or color) images on single color printers that maintain the feeling of continuous tone.

The half tone effect is specifically achieved by printing and/or displaying a pattern of small dots which, from a distance, can meld optically to simulate the desired output color or intensity. In a typical picture printed in half tone, the lightest area of the picture has fewer dots and the darker areas the most. One of the major advantages of using half toning in the present invention is that with half toning there is almost always an electrical path to illuminate the farthest non-deactivated portion of the picture printed on the PEDOT coated film.

The above-described method can also be used to prepare electroplated films. Certain formulations of PEDOT films can be used as seed layers for electroless or electroplated films of metals. This allows the formation of conductive traces on heat sensitive substrates like polyester terephthalate as well as heat resistant materials such as metal or ceramic. These conductive polymer films are printed with ink to deactivate selected areas, the selected areas are then plated to achieve high conductivity traces on the electroplated film to interconnect the pixels and distribute power across large areas.

EXAMPLES

Example 1

To demonstrate patterning of conductive electrodes with inkjet printers and inks, closed forms, circles and polygons, were inkjet printed on squares of media coated with a 125 µm thick film of PEDOT having a resistivity of 350 ohms per square. Electrical conductivity was checked between the inside and the outside of the printed forms on the PEDOT for each of the squares.

The first square, shown in FIG. 1, was printed with a black ink having a pH less than 8.0. The resistances between the inside and outside of the three closed forms at the bottom of the square are all measured to be 700 ohms.

Example 2

Figure 2:
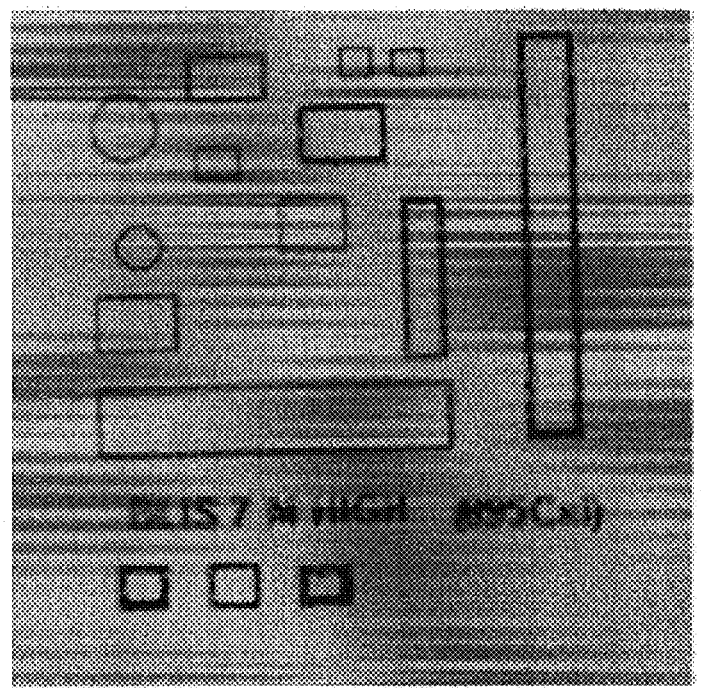
FIG. 2 is a photograph of a square of 125 $\mu$m PET covered by a film of PEDOT, inkjet printed with various forms in magenta ink.

The second square, shown in FIG. 2, was printed with a magenta ink having a pH of 9.5. The resistances between the inside and outside of the three closed forms from left to right at the bottom of the square are measured to be 1200, 800 and 1400 ohms respectively.

Example 3

Figure 3:
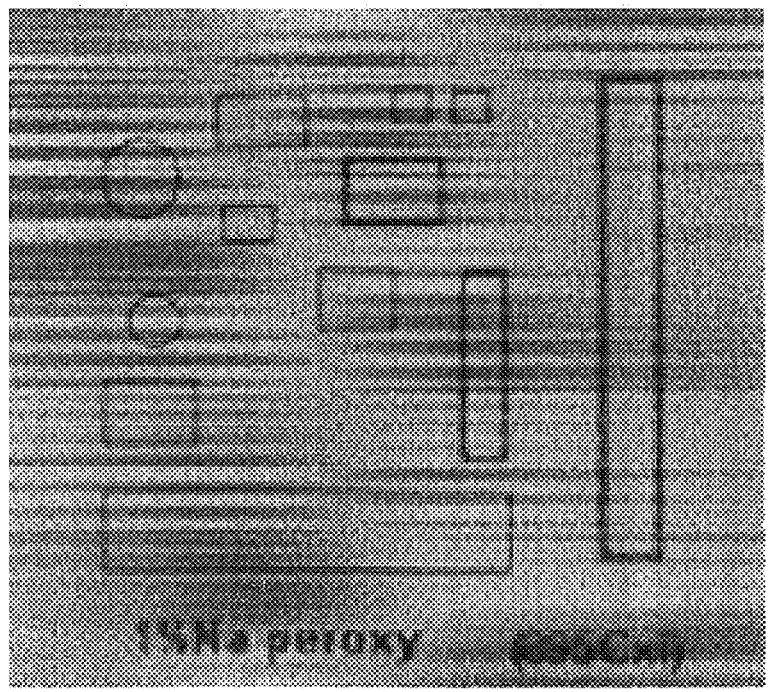
FIG. 3 is a photograph of a square of 125 $\mu$m PET covered by a film of PEDOT, inkjet printed with various forms in black ink.

The third square, shown in FIG. 3, was printed with black ink with strong oxidizers. The composition of the ink included 1% Sodium peroxy disulfate and 0.1% $CuSO_4$. The resistances between the inside and outside of the three closed forms from left to right at the bottom of the square are measured to be 600, 800 and 600 ohms respectively.

Example 4

Figure 4:
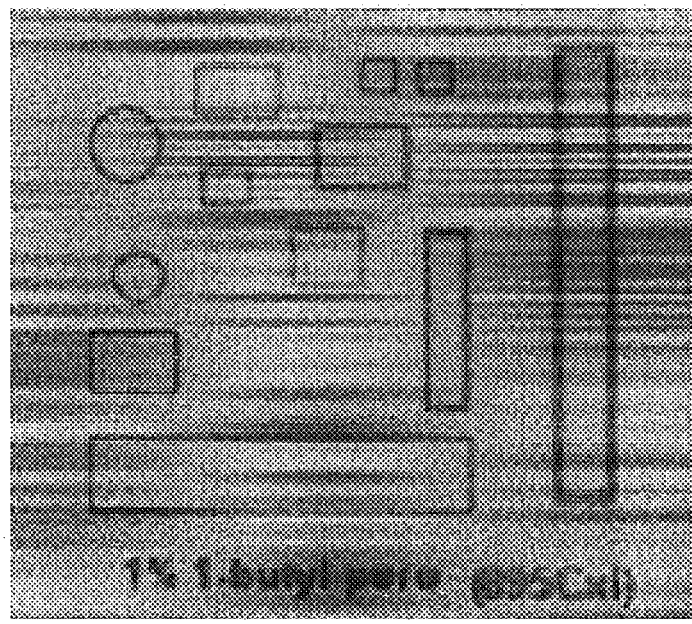
FIG. 4 is a photograph of a square of 125 $\mu$m PET covered by a film of PEDOT, inkjet printed with various forms in black ink.

The fourth square, shown in FIG. 4, was printed with black ink with strong oxidizers. The composition of the ink included 1% t-butyl hydroperoxide and 0.1% $CuSO_4$. The resistances between the inside and outside of the three closed forms from left to right at the bottom of the square are measured to be 2500, 2500 and 1900 ohms respectively.

Example 5

Figure 5:
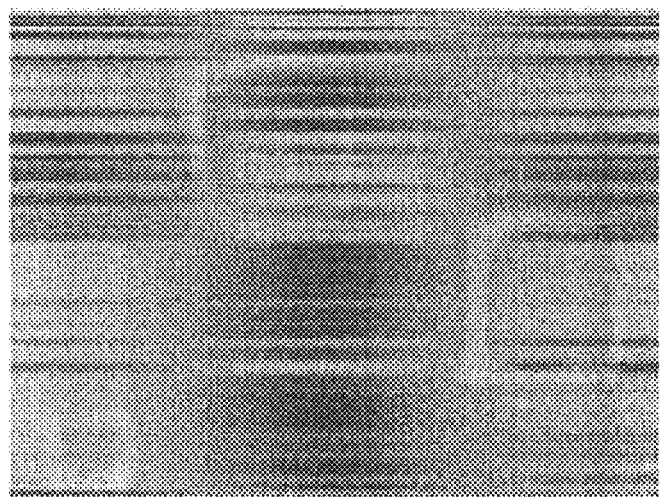
FIG. 5 is a photograph of a square of 125 $\mu$m PET covered by a film of PEDOT, certain segments painted with a 10% solution of NaCIO.

As a comparison, in the third square, shown in FIG. 5, forms were "painted" with a 10% bleach solution (NaCIO in water) by dipping a wooden stick in the bleach solution. The film changes color in a few seconds, but repeated applications are needed to deactivate all sides of the forms. The resistances between the inside and outside of the three closed forms at the bottom of the square are measured from left to right to be 20 million, 8 million and 3 million ohms respectively. These results indicate that the inkjet ink printed patterns may need multiple passes and explain the relatively low level of deactivation of the PEDOT.

Example 6

A conventional electroluminescent display film was made using Indium Tin Oxide (ITO) coated Polyester Terephthalate (PET), phosphor ink and $BaTiO3$ dielectric ink. The first layer facing the viewer was PET, followed secondly by an ITO layer, thirdly by a phosphor layer, fourthly by a dielectric layer and lastly by a silver layer forming the base.

Example 7

One embodiment of the electroluminescent display film for use with the present invention was made using PEDOT instead of ITO. The first layer facing the viewer was PEDOT (the inner layer being the patterned side), followed secondly by an adhesive layer, thirdly by a phosphor layer, fourthly by a dielectric layer and lastly by a silver layer forming the base.

Example 8

Another embodiment of the electroluminescent display film was the same as Example 7 except that there was carrier film forming a fifth attached to silver layer base.

What is claimed is:

1. A method of patterning an electroluminescent light, comprising the steps of:
    printing ink patterns onto an electrically conductive polymer film layer of the electroluminescent light, the electrical conductivity of the film being significantly deactivated where the ink patterns are printed;
    conducting voltage through the electroluminescent light to display the patterns formed where the ink patterns deactivate the electrical conductivity on the polymer film layer.

2. The method of patterning an electroluminescent light of claim 1, wherein the ink patterns are printed as a pattern of dots to achieve a half tone effect.

3. The method of patterning an electroluminescent light of claim 1, wherein the ink images are printed onto the film using an inkjet printhead.

4. The method of patterning an electroluminescent light of claim 1, wherein the electrically conductive polymer film layer comprises a conductive polymer selected from the group consisting of triarylamine derivatives, polythiophenes and polyaniline derivatives.

5. The method of patterning an electroluminescent light of claim 4, wherein the electrically conductive polymer film layer comprises poly(3,4-ethylenedioxythiophene)/poly(styrenesulfonate).

6. The method of patterning an electroluminescent light of claim 1, wherein the ink patterns are printed on a plurality of segregated areas of the film layer,
    and wherein the voltage is switched between the segregated areas of the electroluminescent light so that the segregated areas are illuminated at different times.

7. The method of patterning an electroluminescent light of claim 6, wherein the segregated areas are arranged to be contiguous to each other on the film layer;
    and wherein the voltage is switched between the segregated areas of the electroluminescent light by a serial controller so that the segregated areas are illuminated at different times to portray motion.

8. The method of patterning an electroluminescent light of claim 1, wherein the ink is an aqueous ink having a pH of at least 7.5.

9. The method of patterning an electroluminescent light of claim 8, wherein the ink is an aqueous ink having a pH of at least 8.5.

10. The method of patterning an electroluminescent light of claim 1, wherein the ink is an aqueous ink comprising at least 1% oxidizing agent.

11. The method of patterning an electroluminescent light of claim 10, wherein the oxidizing agent is selected from the group consisting of sodium peroxydisulfate and t-butyl hydroperoxide.

12. An electroluminescent light panel comprising an electrically conductive polymer film layer printed with ink patterns, the electrical conductivity of the film being significantly deactivated where the ink patterns are printed.

13. An electroluminescent light panel of claim 12, wherein the ink patterns are printed as a pattern of dots to achieve a half tone effect.

14. The electroluminescent light panel of claim 12, wherein the ink images are printed onto the film using an inkjet printhead.

15. The electroluminescent light panel of claim 12, wherein the electrically conductive polymer film layer comprises a conductive polymer selected from the group consisting of triarylamine derivatives, polythiophenes and polyaniline derivatives.

16. The electroluminescent light panel of claim 15, wherein the electrically conductive polymer film layer comprises poly(3,4-ethylenedioxythiophene)/poly(styrenesulfonate).

17. The electroluminescent light panel of claim 12, wherein the ink patterns are printed on a plurality of segregated areas of the film layer,
and wherein the voltage is switched between the segregated areas of the electroluminescent light so that the segregated areas are illuminated at different times.

18. The electroluminescent light panel of claim 17, wherein the segregated areas are arranged to be contiguous to each other on the film layer;
and wherein the voltage is switched between the segregated areas of the electroluminescent light by a serial controller so that the segregated areas are illuminated at different times to portray motion.

19. The electroluminescent light panel of claim 12, wherein the ink is an aqueous ink having a pH of at least 7.5.

20. The electroluminescent light panel of claim 19, wherein the ink is an aqueous ink having a pH of at least 8.5.

21. The electroluminescent light panel of claim 12, wherein the ink is an aqueous ink comprising at least 1% oxidizing agent.

22. The electroluminescent light panel of claim 21, wherein the oxidizing agent is selected from the group consisting of sodium peroxydisulfate and t-butyl hydroperoxide.

23. A method of making an electroplated film, comprising the steps of:
printing ink patterns onto an electrically conductive polymer layer web, the electrical conductivity of the film being significantly deactivated where the ink patterns are printed;
plating the printed web to form electrical interconnects by depositing conductive metals.

24. The method of making an electroplated film of claim 23, wherein the ink images are printed onto the film using an inkjet printhead.

25. The method of making an electroplated film of claim 23, wherein the electrically conductive polymer film layer comprises a conductive polymer selected from the group consisting of triarylamine derivatives, polythiophenes and polyaniline derivatives.

26. The method of making an electroplated film of claim 25, wherein the electrically conductive polymer film layer comprises poly(3,4-ethylenedioxythiophene)/poly(styrenesulfonate).

27. The method of making an electroplated film of claim 23, wherein the conductive metals are selected from the group consisting of copper, nickel and gold.

28. The method of making an electroplated film of claim 23, wherein the ink is an aqueous ink having a pH of at least 7.5.

29. The method of making an electroplated film of claim 28, wherein the ink is an aqueous ink having a pH of at least 8.5.

30. The method of making an electroplated film of claim 23, wherein the ink is an aqueous ink comprising at least 1% oxidizing agent.

31. The method of making an electroplated film of claim 30, wherein the oxidizing agent is selected from the group consisting of sodium peroxydisulfate and t-butyl hydroperoxide.

32. An electroplated film comprising an electrically conductive polymer film layer printed with ink patterns, the electrical conductivity of the film being significantly deactivated where the ink patterns are printed; and electrical interconnects formed on the polymer film layer by deposited conductive metals.

33. The electroplated film of claim 32, wherein the ink images are printed onto the film using an inkjet printhead.

34. The electroplated film of claim 32, wherein the electrically conductive polymer film layer comprises a conductive polymer selected from the group consisting of triarylamine derivatives, polythiophenes and polyaniline derivatives.

35. The electroplated film of claim 34, wherein the electrically conductive polymer film layer comprises poly(3,4-ethylenedioxythiophene)/poly(styrenesulfonate).

36. The electroplated film of claim 32, wherein the conductive metals are selected from the group consisting of copper, nickel and gold.

37. The electroplated film of claim 32, wherein the ink is an aqueous ink having a pH of at least 7.5.

38. The electroplated film of claim 37, wherein the ink is an aqueous ink having a pH of at least 8.5.

39. The electroplated film of claim 32, wherein the ink is an aqueous ink comprising at least 1% oxidizing agent.

40. The electroplated film of claim 39, wherein the oxidizing agent is selected from the group consisting of sodium peroxydisulfate and t-butyl hydroperoxide.

* * * * *